(12) United States Patent
Balasubramanian et al.

(10) Patent No.: US 9,337,072 B2
(45) Date of Patent: May 10, 2016

(54) APPARATUS AND METHOD FOR SUBSTRATE CLAMPING IN A PLASMA CHAMBER

(75) Inventors: Ganesh Balasubramanian, Sunnyvale, CA (US); Amit Bansal, Santa Clara, CA (US); Eller Y. Juco, San Jose, CA (US); Mohamad Ayoub, San Jose, CA (US); Hyung-Joon Kim, Sunnyvale, CA (US); Karthik Janakiraman, San Jose, CA (US); Sudha Rathi, San Jose, CA (US); Deenesh Padhi, Sunnyvale, CA (US); Martin Jay Seamons, San Jose, CA (US); Visweswaren Sivaramakrishnan, Cupertino, CA (US); Bok Hoen Kim, San Jose, CA (US); Amir Al-Bayati, San Jose, CA (US); Derek R. Witty, Fremont, CA (US); Hichem M'Saad, Santa Clara, CA (US); Anton Baryshnikov, San Jose, CA (US); Chiu Chan, Foster City, CA (US); Shuang Liu, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1425 days.

(21) Appl. No.: 12/950,105

(22) Filed: Nov. 19, 2010

(65) Prior Publication Data

US 2011/0090613 A1  Apr. 21, 2011

Related U.S. Application Data

(63) Continuation of application No. 11/866,646, filed on Oct. 3, 2007, now abandoned.

(60) Provisional application No. 60/828,108, filed on Oct. 4, 2006, provisional application No. 60/892,430, filed on Mar. 1, 2007.

(51) Int. Cl.
*H02N 13/00* (2006.01)
*H01L 21/683* (2006.01)
(Continued)

(52) U.S. Cl.
CPC ............ *H01L 21/6831* (2013.01); *C23C 16/52* (2013.01); *H01J 37/32431* (2013.01); *H01L 21/67069* (2013.01); *H01L 21/67253* (2013.01)

(58) Field of Classification Search
USPC ........................................................ 361/234
See application file for complete search history.

(56) References Cited

U.S. PATENT DOCUMENTS

| 2,915,689 A | 12/1959 | Eplelboin |
| 5,170,098 A * | 12/1992 | Dutton .............. H01J 37/32192 156/345.26 |

(Continued)

OTHER PUBLICATIONS

Office Action for Korean Patent Application No. 10-2007-7024574 dated May 26, 2009.

(Continued)

*Primary Examiner* — Ronald W Leja
(74) *Attorney, Agent, or Firm* — Patterson & Sheridan, LLP

(57) ABSTRACT

The present invention generally provides methods and apparatus for monitoring and maintaining flatness of a substrate in a plasma reactor. Certain embodiments of the present invention provide a method for processing a substrate comprising positioning the substrate on an electrostatic chuck, applying an RF power between the an electrode in the electrostatic chuck and a counter electrode positioned parallel to the electrostatic chuck, applying a DC bias to the electrode in the electrostatic chuck to clamp the substrate on the electrostatic chuck, and measuring an imaginary impedance of the electrostatic chuck.

12 Claims, 8 Drawing Sheets

(51) Int. Cl.
*C23C 16/52* (2006.01)
*H01J 37/32* (2006.01)
*H01L 21/67* (2006.01)

(56) References Cited

U.S. PATENT DOCUMENTS

| | | | |
|---|---|---|---|
| 5,472,561 A | 12/1995 | Williams et al. | |
| 5,478,429 A | 12/1995 | Komino et al. | |
| 5,557,215 A * | 9/1996 | Saeki et al. | 324/756.01 |
| 5,872,694 A * | 2/1999 | Hoinkis et al. | 361/234 |
| 5,929,717 A * | 7/1999 | Richardson | H01J 37/321 315/111.21 |
| 5,948,986 A * | 9/1999 | Brown | 73/630 |
| 6,074,538 A | 6/2000 | Ohmi et al. | |
| 6,075,375 A | 6/2000 | Burkhart et al. | |
| 6,151,203 A | 11/2000 | Shamouilian et al. | |
| 6,265,831 B1 | 7/2001 | Howald et al. | |
| 6,716,301 B2 | 4/2004 | Kanno et al. | |
| 6,771,481 B2 * | 8/2004 | Nishio | H01J 37/32082 269/8 |
| 6,778,377 B2 | 8/2004 | Hagi | |
| 6,853,953 B2 * | 2/2005 | Brcka et al. | 702/182 |
| 7,015,414 B2 * | 3/2006 | Mitrovic | 219/121.43 |
| 7,019,543 B2 | 3/2006 | Quon | |
| 7,137,352 B2 * | 11/2006 | Yamashita | H01L 21/6833 118/723 E |
| 7,208,067 B2 * | 4/2007 | Mitrovic | H01L 21/67248 156/345.27 |
| 7,932,726 B1 * | 4/2011 | Vermeire | H01L 21/67288 324/525 |
| 8,242,789 B2 * | 8/2012 | Daniels | H01J 37/32027 324/637 |
| 2004/0135590 A1 * | 7/2004 | Quon | 324/713 |
| 2006/0065631 A1 | 3/2006 | Cheng et al. | |
| 2006/0256499 A1 | 11/2006 | Yang et al. | |
| 2007/0127188 A1 | 6/2007 | Yang et al. | |
| 2008/0084650 A1 | 4/2008 | Balasubramanian et al. | |
| 2011/0090613 A1 * | 4/2011 | Balasubramanian | C23C 16/52 361/234 |

OTHER PUBLICATIONS

International Search Report and Written Opinion of the International Searching Authority mailed Apr. 8, 2008 in PCT/US2007/80491.
First Office Action dated Dec. 2, 2010 for Chinese Patent Application No. 200780037481.1.
Office Action for Taiwan Patent Application No. 96137319 dated Sep. 19, 2012.
Notice of Second Office Action dated Jan. 18, 2012 for Chinese Patent Application No. 200780037481.1.
Office Action for Taiwan Patent Application No. 96137319 dated May 4, 2012.

* cited by examiner

APPARATUS AND METHOD FOR SUBSTRATE CLAMPING IN A PLASMA CHAMBER

CROSS REFERENCE TO RELATED APPLICATIONS

This application is a continuation of U.S. patent application Ser. No. 11/866,646, filed Oct. 3, 2007 now abandoned, which claims benefit of U.S. Provisional Patent Application Ser. No. 60/828,108, filed Oct. 4, 2006, and U.S. Provisional Patent Application Ser. No. 60/892,430, filed Mar. 1, 2007, which are herein incorporated by reference.

BACKGROUND OF THE INVENTION

1. Field of the Invention

Embodiments of the present invention generally relate to an apparatus and method for processing semiconductor substrates. More particularly, embodiments of the present invention relate to an electrostatic chuck used in a plasma chamber.

2. Description of the Related Art

Plasma enhance processes, such as plasma enhanced chemical vapor deposition (PECVD) process, high density plasma chemical vapor deposition (HDPCVD) process, plasma immersion ion implantation process (P3I), and plasma etch process, have become essential in semiconductor processing.

Plasma provides many advantages in manufacturing semiconductor devices. For example, using plasma enables a wide range of applications due to lowered processing temperature, plasma enhanced deposition has excellent gap-fill for high aspect ratio gaps and high deposition rates.

One problem that occurs during plasma processing is deformation of a substrate being processed, especially for a device substrate, i.e. a patterned substrate. Semiconductor devices are formed by stacking layers of materials by certain pattern on a semiconductor substrate. A patterned substrate may "bow" during processes due to differences in thermal expansion among layers of different materials, particularly when the substrate is being heated. Bowing of the substrate may lead to non uniformity of the process surface. Sides and back of a bowed substrate may be processed which not only wastes processing material, as precursors for plasma processing are usually very expensive, but also causes contaminations and other troubles for subsequent process steps.

FIG. 1 (prior art) schematically illustrates a substrate bowing scenario during a plasma process. A plasma reactor 10 comprises an electrode 12 connected to a radio frequency (RF) power 17 through an impedance matching circuit 16. A grounded electrode 11 is configured to support a substrate 13 thereon. The electrode 12 and the grounded electrode 11 form a capacitive plasma generator. When proper RF power is added to the electrode 12, a plasma 15 may be generated from any precursor gas supplied between the electrode 12 and the grounded electrode 11 to process the substrate 13. The substrate 13 may be heated by a heater 18 embedded in the grounded electrode 11. The plasma 15 also heats the substrate 13 during process. A plasma processing temperature may be between about 250° C. to about 450° C. The substrate 13 may bow as temperature rises. In some cases, the edge of a 300 mm substrate may bow as much as 0.4 mm. The bowing substrates are sometime referred as substrates with high curvatures.

Bowing of a substrate presents a challenge for process uniformity on a device side 14 of the substrate 13, which becomes more and more critical as feature size shrinks. External means, such as an electrostatic chuck or a vacuum chuck, are used to keep a substrate flat during processing. However, a chucked substrate may still become deformed during a plasma process due to heat dissipated by the plasma.

Therefore, there is a need for an apparatus and method for clamping a substrate while maintaining flatness of the substrate during a plasma process.

SUMMARY OF THE INVENTION

The present invention generally provides methods and apparatus for monitoring and maintaining flatness of a substrate in a plasma reactor.

Certain embodiments of the present invention provide a method for processing a substrate, comprising positioning the substrate on an electrostatic chuck, applying an RF power between the an electrode in the electrostatic chuck and a counter electrode positioned parallel to the electrostatic chuck, applying a DC bias to the electrode in the electrostatic chuck to clamp the substrate on the electrostatic chuck, and measuring an imaginary impedance of the electrostatic chuck.

Certain embodiments of the present invention provide a method for monitoring a substrate during a plasma process, comprising positioning the substrate in a plasma generator having first and second parallel electrodes, wherein the substrate is positioned between the first and second parallel electrodes and substantially parallel to the first and second parallel electrodes, applying an RF power between the first and second electrodes of the plasma generator, and monitoring the substrate by measuring a characteristic of the plasma generator.

Certain embodiments of the present invention provide an apparatus for processing a substrate, comprising an electrostatic chuck comprising a first electrode connected with a DC power supply, wherein the electrostatic chuck has a supporting surface configured to support the substrate thereon, a counter electrode positioned substantially parallel to the supporting surface of the electrostatic chuck, wherein the counter electrode is positioned a distance apart from the electrostatic chuck, the substrate is configured to be positioned between the electrostatic chuck and the counter electrode, a RF power supply configured to apply a RF power between the first electrode and the counter electrode, and a sensor configured to measure a characteristic of the electrostatic chuck.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
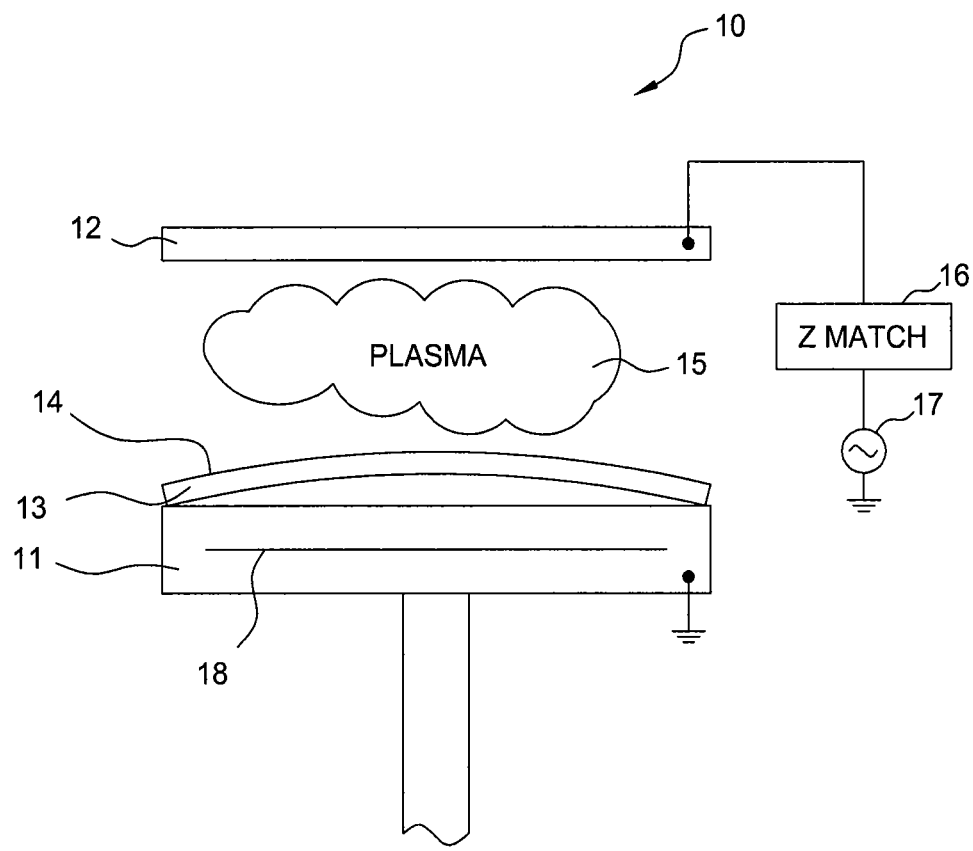
FIG. 1 (prior art) schematically illustrates a substrate bowing scenario during a plasma process.

To facilitate understanding, identical reference numerals have been used, wherever possible, to designate identical elements that are common to the figures. It is also contemplated that elements disclosed in one embodiment may be beneficially utilized on other embodiments without specific recitation.

DETAILED DESCRIPTION

The present invention generally provides methods and apparatus for monitoring and maintaining sufficient flatness of a substrate being processed in a plasma reactor having a plasma generator with parallel electrodes.

Figure 2:
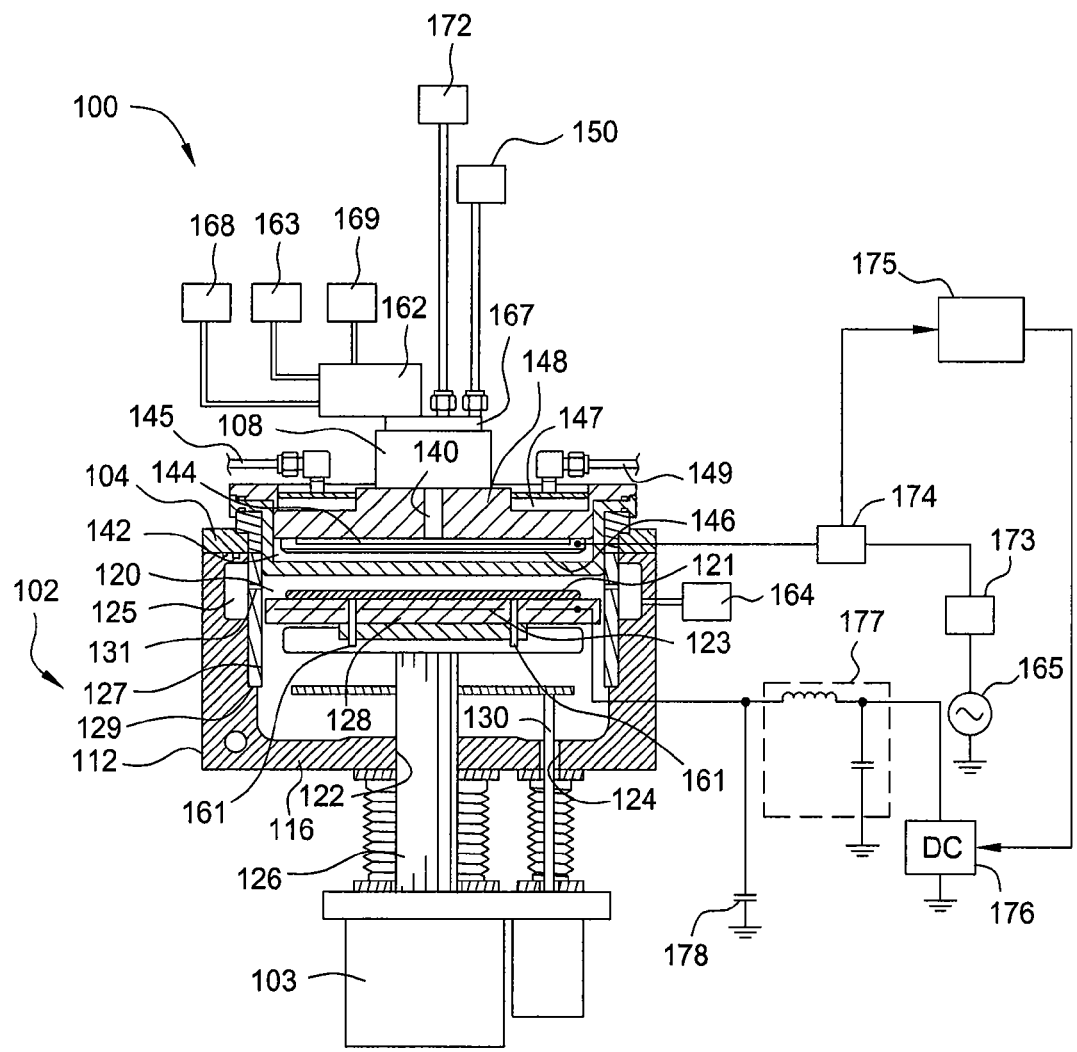
FIG. 2 schematically illustrates a cross sectional view of a PECVD system in accordance with one embodiment of the present invention.

FIG. 2 illustrates a cross sectional view of a PECVD system 100 in accordance with the present invention. Descriptions of similar PECVD systems may be found in U.S. Pat. Nos. 5,855,681, 6,495,233, and 6,364,954.

The PECVD system 100 generally comprises a chamber body 102 supporting a chamber lid 104 which may be attached to the chamber body 102 by a hinge. The chamber body 102 comprises sidewalls 112 and a bottom wall 116 defining a processing region 120. The chamber lid 104 may comprise one or more gas distribution systems 108 disposed therethrough for delivering reactant and cleaning gases into the processing region 120. A circumferential pumping channel 125 formed in the sidewalls 112 and coupled to a pumping system 164 is configured for exhausting gases from the processing region 120 and controlling the pressure within the processing region 120. Two passages 122 and 124 are formed in the bottom wall 116. A stem 126 of an electrostatic chuck passes through the passage 122. A rod 130 configured to activate substrate lift pins 161 passes through the passage 124.

A chamber liner 127, preferably made of ceramic or the like, is disposed in the processing region 120 to protect the sidewalls 112 from the corrosive processing environment. The chamber liner 127 may be supported by a ledge 129 formed in the sidewalls 112. A plurality of exhaust ports 131 may be formed on the chamber liner 127. The plurality of exhaust ports 131 is configured to connect the processing region 120 to the pumping channel 125.

The gas distribution system 108 is configured to deliver reactant and cleaning gases and is disposed through the chamber lid 104 to deliver gases into the processing region 120. The gas distribution system 108 includes a gas inlet passage 140 which delivers gas into a shower head assembly 142. The showerhead assembly 142 is comprised of an annular base plate 148 having a blocker plate 144 disposed intermediate to a faceplate 146.

A cooling channel 147 is formed in the base plate 148 of the gas distribution system 108 to cool the base plate 148 during operation. A cooling inlet 145 delivers a coolant fluid, such as water or the like, into the cooling channel 147. The coolant fluid exits the cooling channel 147 through a coolant outlet 149.

The chamber lid 104 has matching passages to deliver gases from one or more gas inlets 168, 163, 169 through a remote plasma source 162 to a gas inlet manifold 167 positioned on top of the chamber lid 104. The PECVD system 100 may comprise one or more liquid delivery sources 150 and one or more gas sources 172 configured to provide a carrier gas and/or a precursor gas.

The electrostatic chuck 128 is configured for supporting and holding a substrate being processed. In one embodiment, the electrostatic chuck 128 may comprise at least one electrode 123 to which a voltage is applied to electrostatically secure a substrate thereon. The electrode 123 is powered by a direct current (DC) power supply 176 connected to the electrode 123 via a low pass filter 177.

Although a monopolar DC chuck is depicted and discussed below, the invention may operate using any type of electrode structure and drive voltage combination that permits measurement of impedance of the electrostatic chuck. The electrostatic chuck 128 may be bipolar, tripolar, DC, interdgitated, zonal and the like.

In one embodiment, the electrostatic chuck 128 is movably disposed in the processing region 120 driven by a drive system 103 coupled to the stem 126. The electrostatic chuck 128 may comprise heating elements, for example resistive elements, to heat a substrate positioned thereon to a desired process temperature. Alternatively, the electrostatic chuck 128 may be heated by an outside heating element such as a lamp assembly. The drive system 103 may include linear actuators, or a motor and reduction gearing assembly, to lower or raise the electrostatic chuck 128 within the processing region 120.

An RF source 165 is coupled to the shower head assembly 142 through an impedance matching circuit 173. The faceplate 146 of the showerhead assembly 142 and the electrode 123, which may be grounded via a high pass filter, such as a capacitor 178, form a capacitive plasma generator. The RF source 165 provides RF energy to the showerhead assembly 142 to facilitate generation of a capacitive plasma between the faceplate 146 of the showerhead assembly 142 and the electrostatic chuck 128. Thus, the electrode 123 provides both a ground path for the RF source 165 and an electric bias from the DC source 176 to enable electrostatic clamping of the substrate.

The RF source 165 may comprise a high frequency radio frequency (HFRF) power source, e.g., a 13.56 MHz RF generator, and a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

In certain embodiments, properties of a substrate secured on the electrostatic chuck 128 may be monitored during a plasma process. In certain embodiments, flatness of a substrate secured on the electrostatic chuck 128 may be monitored during a plasma process. In one embodiment, flatness of a substrate secured on the electrostatic chuck 128 may be monitored by measuring characteristics of the electrostatic chuck 128 with the substrate secured thereon. In one embodiment, impedance of the electrostatic chuck 128 may be measured to monitor the flatness of a substrate secured thereon.

In one embodiment, impedance of the electrostatic chuck 128 is measured by a sensor 174 connected with the faceplate 146. In one embodiment, the sensor 174 may be a VI probe connected between the faceplate 146 and the impedance matching circuit 173. The sensor 174 may be configured to measure impedance of the electrostatic chuck 174 by measuring voltage and current of the capacitor formed by the faceplate 146 and the electrode 123.

It has been observed that capacitance between the faceplate 146 and the electrode 123 is effected by the flatness of a substrate 121 positioned between the faceplate 146 and the electrode 123. An electrostatic chuck, such as the electrostatic chuck 128, has an increased capacitive reactance when a substrate disposed thereon becomes less flat. When a substrate is not flat, for example deformed from the heat of the plasma, there is non uniform distribution of air gap between the substrate and the electrostatic chuck 128. Therefore, variation in flatness of the substrate in an electrostatic chuck results in variation of capacitance of the plasma reactor, which may be measured by variation of imaginary impedance of the electrostatic chuck.

During a plasma process, a substrate positioned on an electrostatic chuck may increase in curvature due to deformation from heating, increased thickness of deposited film, lost of chucking power, or the combination thereof. The deformation of the substrate may increase non-uniformity of the process. In one embodiment, flatness of the substrate being processed may be monitored by measuring imaginary impedance of an electrostatic chuck that secures the substrate. In one embodiment, chucking voltage of the electrostatic chuck may be adjusted to correct substrate deformation.

As shown in FIG. 2, the sensor 174 may be connected to a system controller 175. The system controller 175 may be configured to calculate and adjust the flatness of the substrate 121 being processed in the PECVD system 100. In one embodiment, the system controller 175 may calculate flatness or chucking status of the substrate 121 by monitoring imaginary impedance of the electrostatic chuck 128. When measurement of the imaginary impedance indicates that the substrate 121 decreases in flatness, the system controller 175 may increase chucking power by adjusting the DC source 176. In one embodiment, decreased flatness of the substrate 121 may be indicated by negatively increased imaginary impedance of the electrostatic chuck 128.

Figure 3:
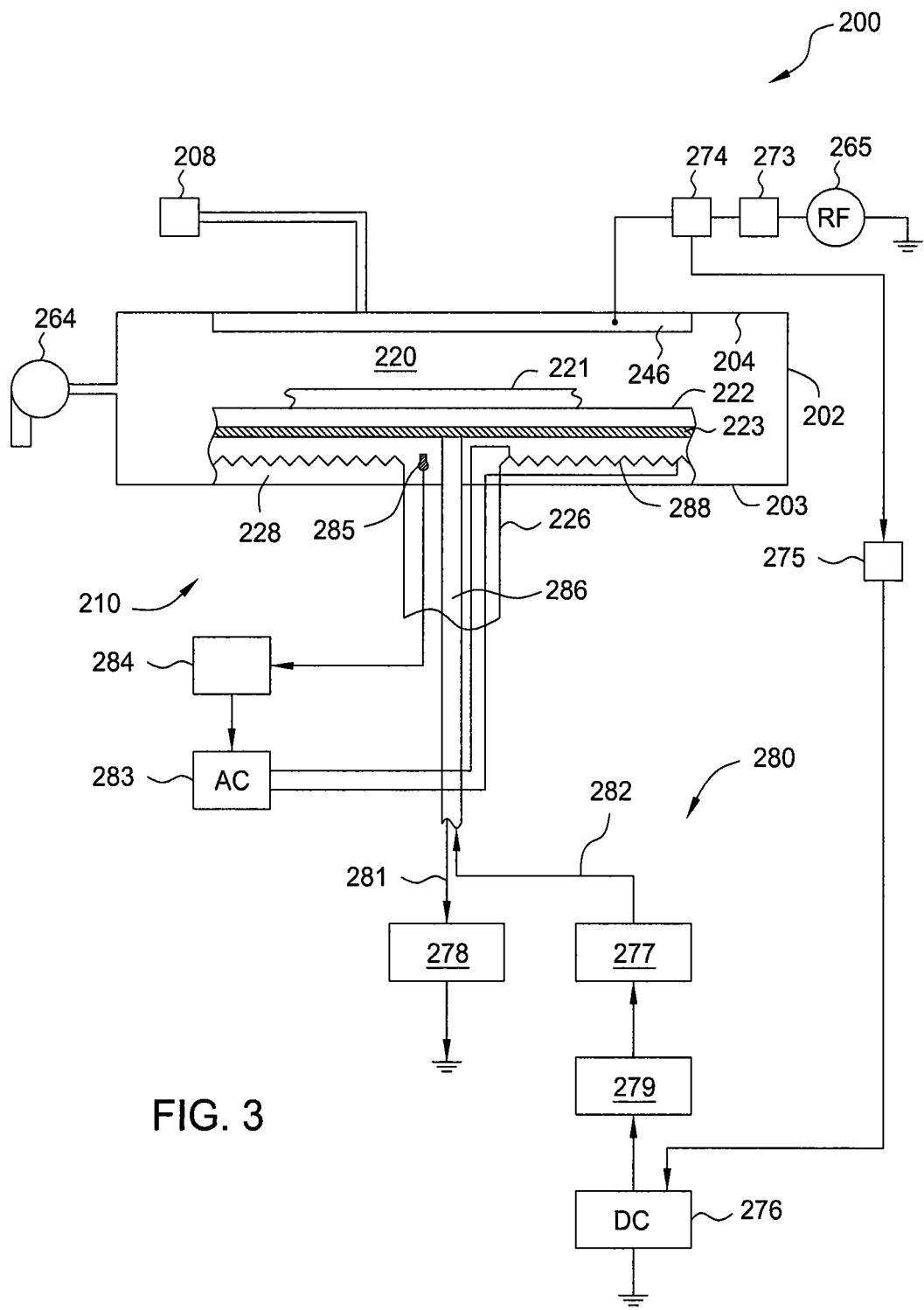
FIG. 3 is a schematic side view of a plasma processing chamber having an electrostatic chuck in accordance with one embodiment of the present invention.

FIG. 3 is a schematic side view of a plasma processing chamber 200 having a substrate support 210 in accordance with one embodiment of the present invention.

The plasma processing chamber 200 comprises sidewalls 202, a bottom 203, and a lid 204 to define an interior volume 220. The interior volume 220 is in fluid communication with a vacuum system 264. A substrate support 210 for supporting a substrate 221 and a faceplate 246 or showerhead to supply a process gas are disposed in the interior volume 220.

An RF source 265 is coupled to the faceplate 246 through an impedance matching circuit 273. The faceplate 246 and the electrode 223, which may be grounded via a high pass filter, such as a capacitor, form a capacitive plasma generator. The RF source 265 provides RF energy to the faceplate 246 to facilitate generation of a capacitive plasma between the faceplate 246 and the substrate support 210.

The RF source 265 may comprise a high frequency radio frequency (HFRF) power source, e.g., a 13.56 MHz RF generator, and a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

In this embodiment, the substrate support 210 is an electrostatic chuck to provide support and clamp the substrate 221 during processing and, in one embodiment, the electrostatic chuck is a mono polar electrostatic chuck. The substrate support 210 comprises a body 228 coupled to a support stem 226. The body 228 may comprise a ceramic material, such as aluminum oxide ($Al_2O_3$), aluminum nitride (AlN), silicon dioxide ($SiO_2$), or other ceramic materials. In one embodiment, the body 228 of the substrate support 210 is configured to be used in a temperature in the range of about −20 degrees C. to about 700 degrees C.

The body 228 may also be disposed in, or coated with, a dielectric layer 222. The body 228 also includes an embedded heater 288, which may be a resistive heater, cartridge heaters, or the like, to provide heat to the body 228. The heat from the heater 288 is then transferred to the substrate 221 to enhance a fabrication process, such as a deposition process. The heater 288 is coupled to a power source 283 through the stem 226 to supply power to the heater 288. The heater 288 may be a mesh or a perforated sheet of material made of molybdenum (Mo), tungsten (W), or other material with a substantially similar coefficient of expansion to that of the ceramic material comprising the body 228. A temperature sensor 285 is embedded in the body 228. In one embodiment, the temperature sensor 285 may be a thermal couple. The temperature sensor 285 may be connected to a temperature controller 284 which provides control signal to the power source 283 to control the temperature of the body 228.

The body 228 of the substrate support 210 further comprises an electrode 223 that may at least provide a path to ground for radio frequency (RF) power. Some commercially used substrate supports have a biasing electrode embedded or disposed in the body of the substrate supports (not shown). The biasing electrode functions to provide an electrical bias to the substrate to promote or enhance the electrostatic clamping of the substrate. As will be explained in detail below, the biasing electrode is replaced by the electrode 223, wherein the electrode 223 provides a ground path for RF power and also provides an electrical bias to the substrate 221 to enable electrostatic clamping of the substrate.

Although the heater 288 is shown in a position below the electrode 223, the electrode may be disposed along the same plane as the heater 288, or below the heater 288. The electrode 223 may be a mesh or a perforated sheet of material made of molybdenum (Mo), tungsten (W), or other material with a substantially similar coefficient of expansion to that of the ceramic material comprising the body 228.

The electrode 223 is coupled to a conductive member 286. The conductive member 286 may be a rod, a tube, wires, or the like, and be made of a conductive material, such as molybdenum (Mo), tungsten (W), or other material with a substantially similar coefficient of expansion with other materials comprising the substrate support 210. Similar to the electrode 123 of FIG. 2, the electrode 223 provides both a ground path for the RF source 265 and an electric bias to enable electrostatic clamping of a substrate. In order to provide an electrical bias to the substrate 221, the electrode 223 is in electronic communication with a Power supply system 280 that supplies a biasing voltage to the electrode 223. The CD power supply 280 includes a power source 276 that may be a direct current (DC) power source to supply a DC signal to the electrode 223. In one embodiment, the power source 276 is a 24 volt DC power supply and the electrical signal may provide a positive or negative bias.

The power source 276 may be coupled to an amplifier 279 to amplify the electrical signal from the power source 276. The amplified electrical signal travels to the conductive member 286 by a connector 282, and may travel through a filter 277 to filter the amplified signal to remove noise and/or remove any RF current from the biasing voltage from the power supply system 280. The amplified and filtered electrical signal is provided to the electrode 223 and the substrate 221 to enable electrostatic clamping of the substrate 221.

The electrode 223 also functions as an RF ground, wherein RF power is coupled to ground by a connector 281. A capacitor 278 may also be coupled to the ground path to prevent the biasing voltage from going to ground. In one embodiment, the capacitor 278 may be a 0.054 micro Farad (µF), 10-15 amps at about 2000 volts. In this manner, the electrode 223 functions as a substrate biasing electrode and an RF return electrode.

In one embodiment, the chamber impedance is evaluated and monitored to monitor positive clamping of the substrate to the substrate support 210. The impedance may be monitored by RF diagnostics, such as monitoring the RF match, using a probe sold under the trade name of Z-SCAN™, a current/voltage probe, or the like. In one embodiment, impedance of the chamber is measured by a sensor 274 connected with the faceplate 246. In one embodiment, the sensor 274 may be a VI probe connected between the faceplate 146 and the impedance matching circuit 273. The sensor 274 may be configured to measure impedance of the electrostatic chuck 210 by measuring voltage and current of the capacitor formed by the faceplate 246 and the electrode 223.

It has been observed that capacitance between the faceplate 246 and the electrode 223 is effected by the flatness of a substrate 221 positioned between the faceplate 246 and the electrode 223. An electrostatic chuck, such as the substrate support 210, has an increased capacitive reactance when a substrate disposed thereon becomes less flat. When a substrate is not flat, for example deformed from the heat of the plasma, there is non uniform distribution of air gap between the substrate and the substrate support 210. Therefore, variation in flatness of the substrate in an electrostatic chuck results in variation of capacitance of the plasma reactor, which may be measured by variation of imaginary impedance of the electrostatic chuck.

The sensor 274 may be connected to a system controller 275. The system controller 275 may be configured to calculate and adjust the flatness of the substrate 221 being processed in the plasma processing chamber 200. In one embodiment, the system controller 275 may calculate flatness or chucking status of the substrate 221 by monitoring imaginary impedance. When measurement of the imaginary impedance indicates that the substrate 221 decreases in flatness, the system controller 275 may increase chucking power by adjusting the power source 276. In one embodiment, decreased flatness of the substrate 221 may be indicated by negatively increased imaginary impedance of the substrate support 210.

Figure 4:
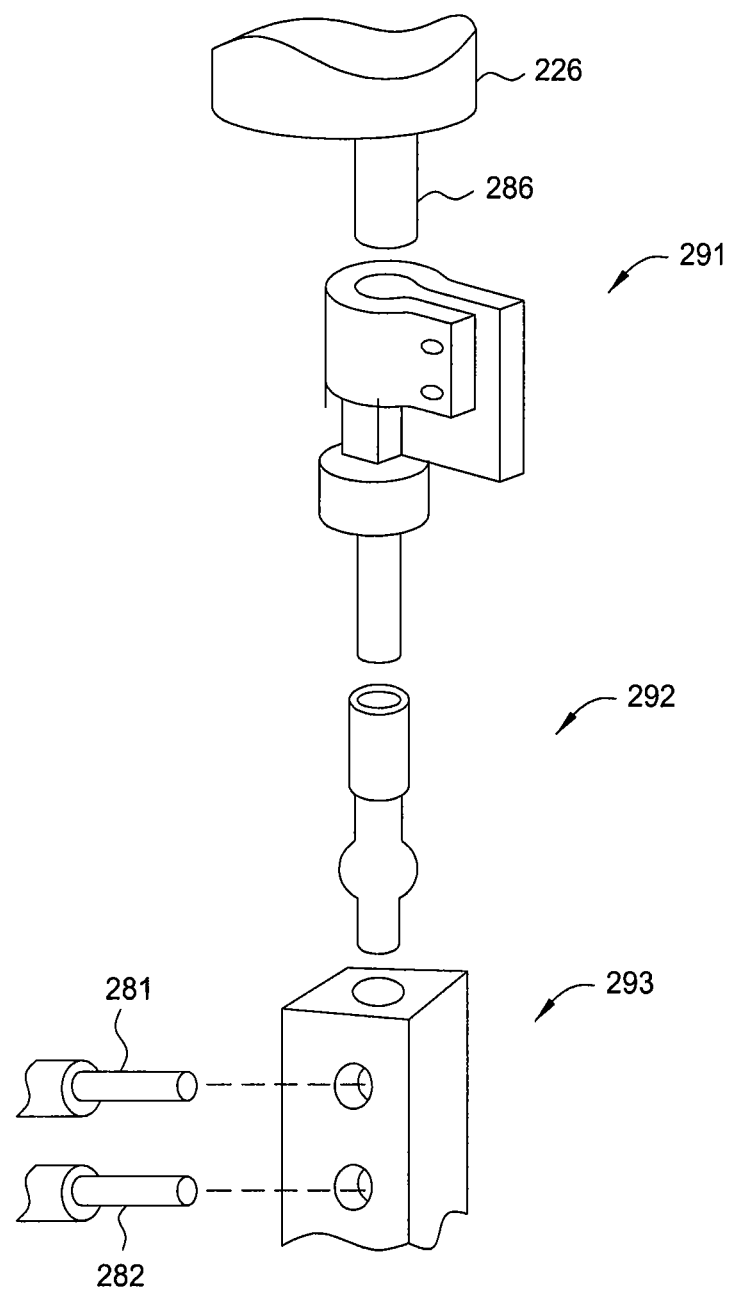
FIG. 4 schematically illustrates an electrostatic chuck clamp design in accordance with one embodiment of the present invention.

FIG. 4 schematically illustrates an exploded view of an electrostatic chuck clamp design in accordance with one embodiment of the present invention. As described in FIG. 3, the electrode 223 of the substrate support 210 is connected to the ground to provide a return path for the RF source 265 that provides RF energy for plasma generation, and is also connected to the Power supply system 280 to provide a bias for electrostatically clamp the substrate 221. The electrode 223 is coupled to the conductive member 286, which extends through the support stem 226. An extended clamp 291 is clamped to the conductive member 286. A multi-contact connector 292 is coupled to the extended clamp 291. In one embodiment, the multi-contact connector 292 is silver brazed to the extended clamp 291. The multi-contact connector 292 is inserted into a RF bar 293 configured to provide one or more electronic connections. Exemplary multi-contact connector 292 is available from Multi-Contact AG, Basel, Switzerland. In one embodiment, the connector 281, 282, which are in electronic communication with the return path of the RF source 265 and the Power supply system 280 respectively, may be connected to the conductive member 286 through the RF bar 293.

Figure 5:
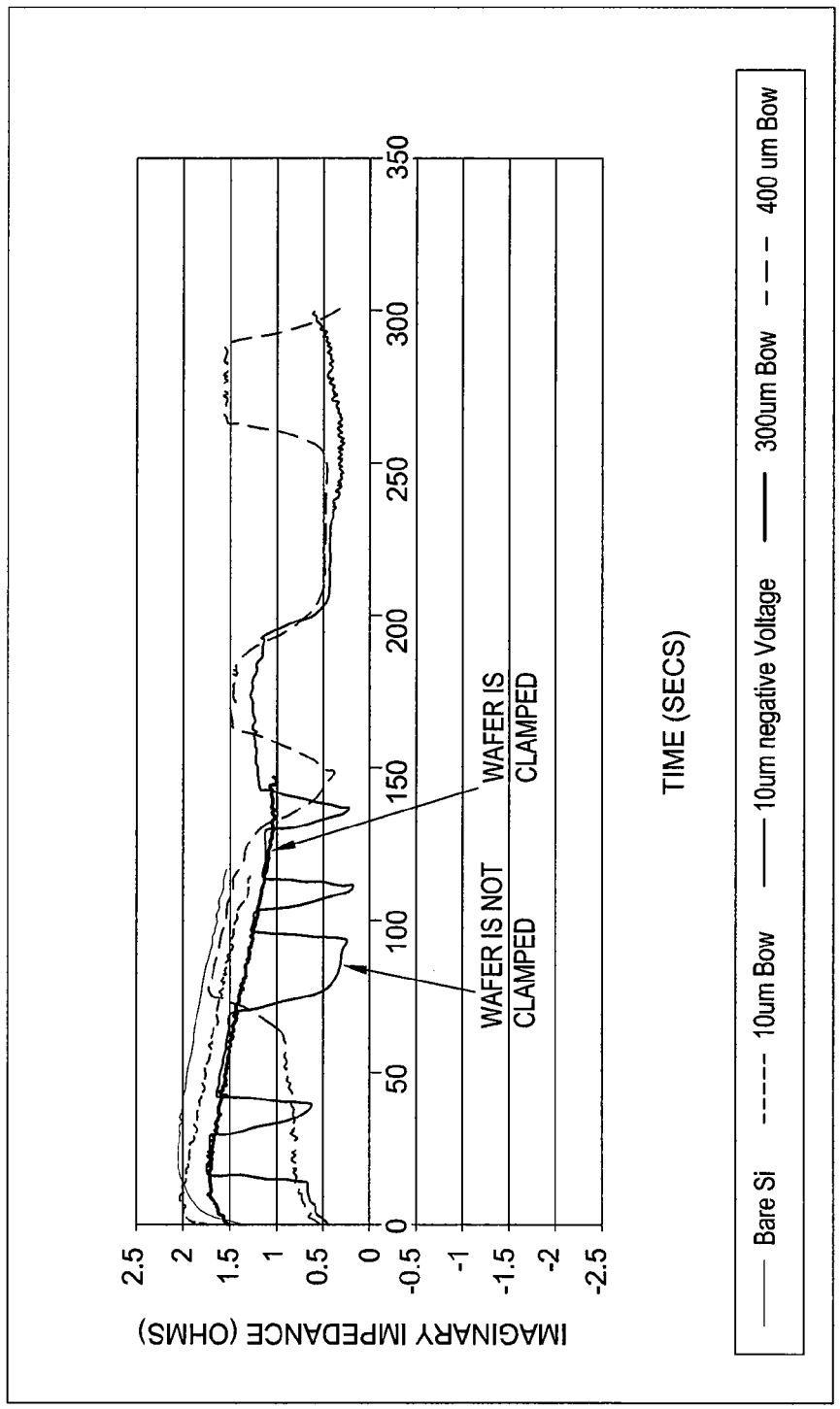
FIG. 5 is a graph showing the imaginary chamber impedance.
Figure 6:
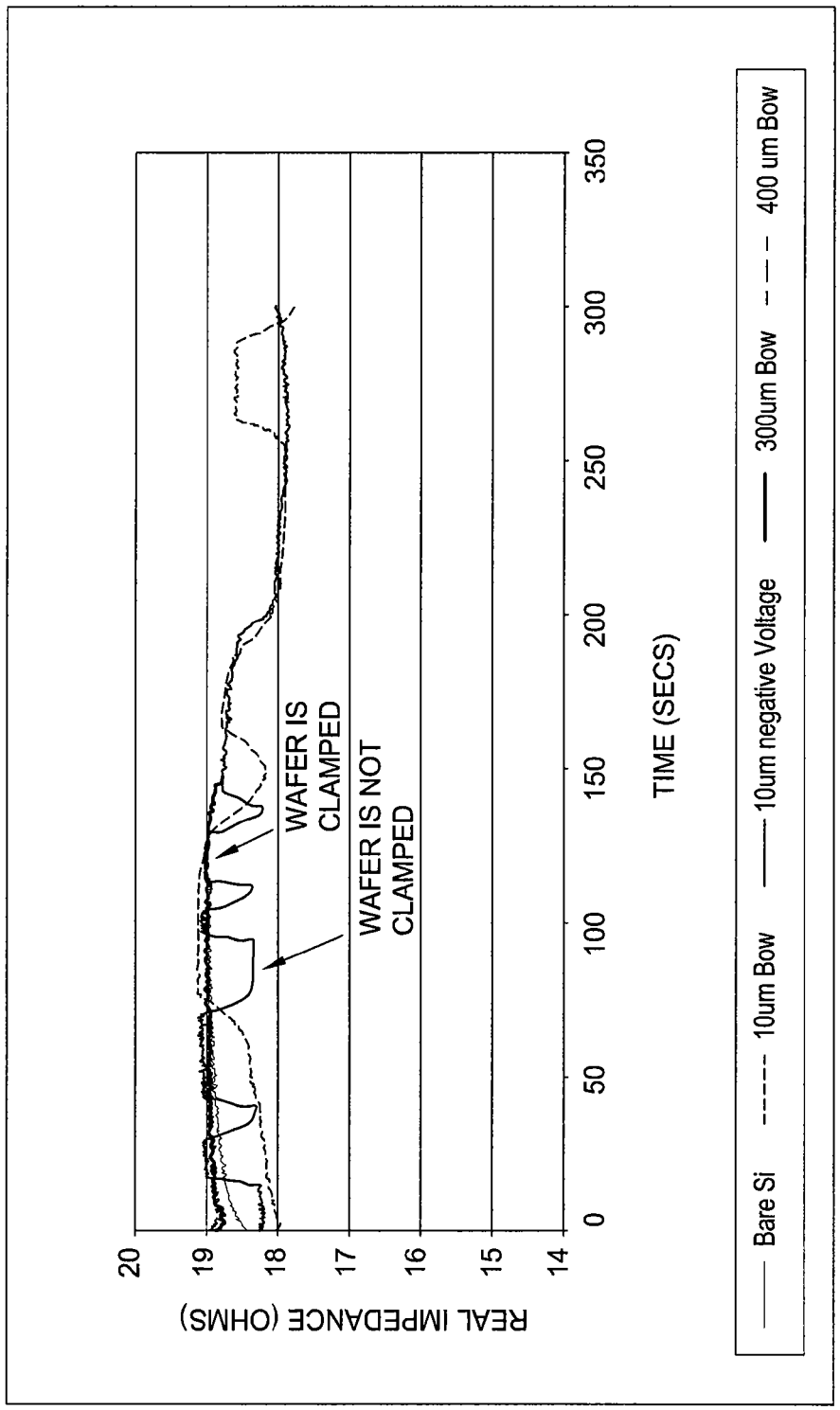
FIG. 6 is a graph showing real chamber impedance.

FIG. 5 is a graph showing the imaginary impedance of the chamber, while FIG. 6 shows real chamber impedance when the electrode 223 and Power supply system 280 are used. For the illustrated results, a bare silicon substrate wafer was used, and wafers having a film or layers of materials deposited thereon, which caused the wafers to become non-planar or bow to about 10 microns from flat, about 300 microns from flat, and about 400 microns from flat were used. The graphs show positive clamping and flattening of the wafers by increasing the biasing voltage over time. The chucking of the wafers is observed by monitoring chamber impedance. Positive chucking of the wafers is observed when impedance of the chamber is constant.

The substrate support 210 having the electrode 223 and Power supply system 280 enables numerous benefits for plasma processing of semiconductor substrates. The power adjustment and positive clamping increases throughput by eliminating or minimizing adverse effects that may be produced by non-planar substrates. For example, when a non-planar substrate is provided to the substrate support 210, such as a convex or concave substrate, the electrical signal from the power source 276 may be slowly increased to bring the center or edge of the substrate into contact with the receiving surface of the substrate support 210 as needed. As the center or edge is chucked, the substrate is flattened and is in more uniform communication with the substrate support, which increases global thickness uniformity of deposited materials. Normalization between chambers may also be enhanced as the substrates are transferred from chamber to chamber with varying degrees of bowing. The positive clamping of the substrate provided by the electrode 223 also enhances plasma stability by improving thermal communication between the substrate and the heater 288.

Figure 7:
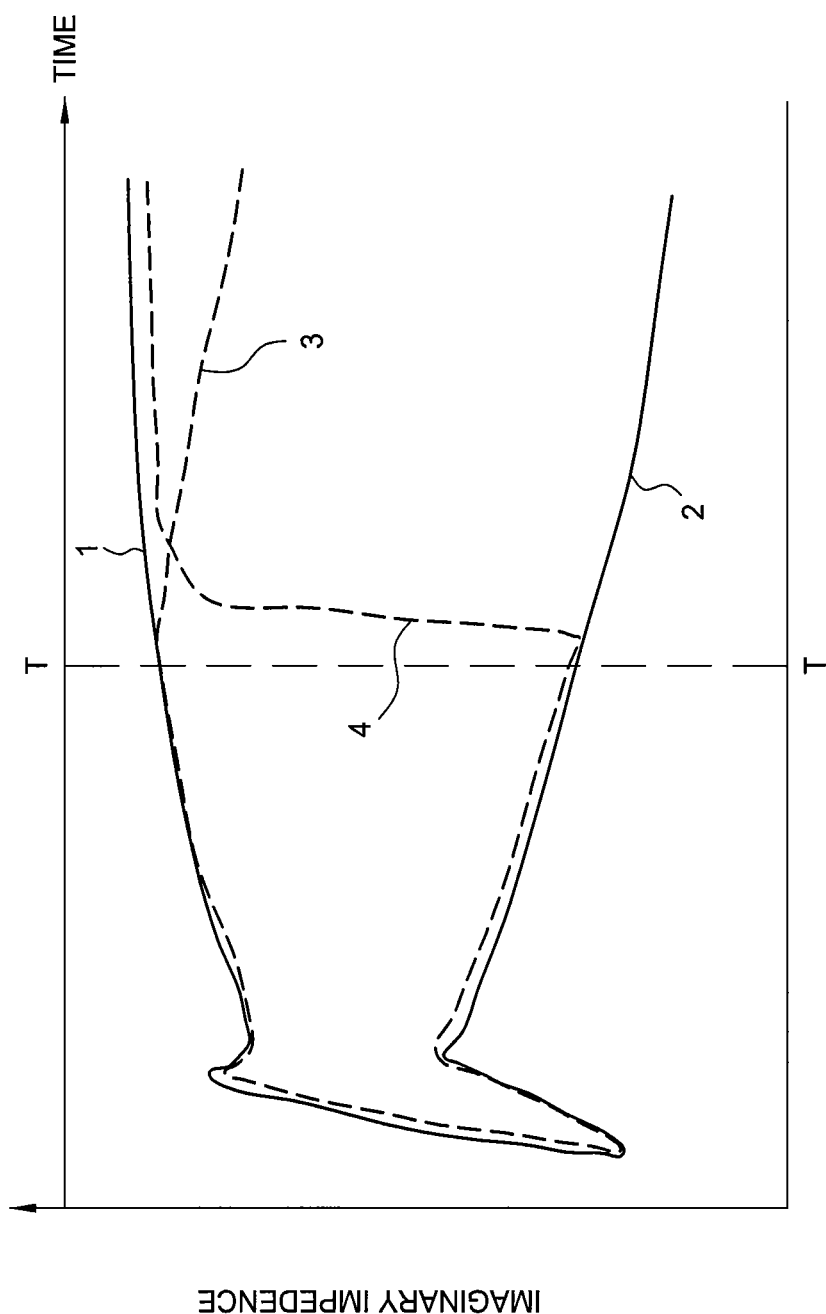
FIG. 7 schematically illustrates a chart showing coordination between imaginary impedance of an electrostatic chuck and flatness of a substrate positioned on the electrostatic chuck.

FIG. 7 schematically illustrates a chart showing coordination between imaginary impedance of an electrostatic chuck and flatness of a substrate positioned on the electrostatic chuck. The x axis of FIG. 7 denotes time. The y axis of FIG. 3 denotes imaginary impedance of an electrostatic chuck in a plasma reactor, wherein the electrostatic chuck functions as an electrode of a capacitive plasma generator of the plasma reactor. The imaginary impedance of the electrostatic chuck may be measured by a VI probe when a RF power is applied to the capacitive plasma generator. The VI probe may measure voltage and current, from which impedance may be calculated using Ohm's Law.

Curve 1 of FIG. 7 schematically illustrates an imaginary impedance measurement of the electrostatic chuck when a substrate positioned thereon is flat. The flatness of the substrate is typically altered during processing unless the substrate is a bare silicon wafer or the substrate is sufficiently chucked by the electrostatic chuck. The imaginary impedance of curve 1 has an overall positive slope.

Curve 2 of FIG. 7 schematically illustrates an imaginary impedance measurement of the electrostatic chuck when the substrate disposed on the electrostatic is curved and no electrostatic chucking is applied to the substrate. The imaginary impedance of curve 2 has an overall negative slope.

Curve 3 of FIG. 7 schematically illustrates an imaginary impedance measurement of the electrostatic chuck when the substrate disposed on the electrostatic is curved. Electrostatic chucking is applied to the substrate until time T. At time T, the substrate is unchucked. The imaginary impedance of curve 3 has a positive slope prior to time T, when the substrate is chucked. Curve 3 has a negative slope when the substrate become unchucked.

Curve 4 of FIG. 7 schematically illustrates an imaginary impedance measurement of the electrostatic chuck when the substrate disposed on the electrostatic is curved. No electrostatic chucking is applied to the substrate until time T. At time T, the substrate is chucked. The imaginary impedance of curve 4 has a negative slope prior to time T, when the substrate is not chucked. Curve 4 has a positive slope shortly after the substrate become chucked.

In one embodiment, flatness of a substrate positioned on an electrostatic chuck during a plasma process may be monitored by calculating a slope of the imaginary impedance of the electrostatic chuck.

Figure 8:
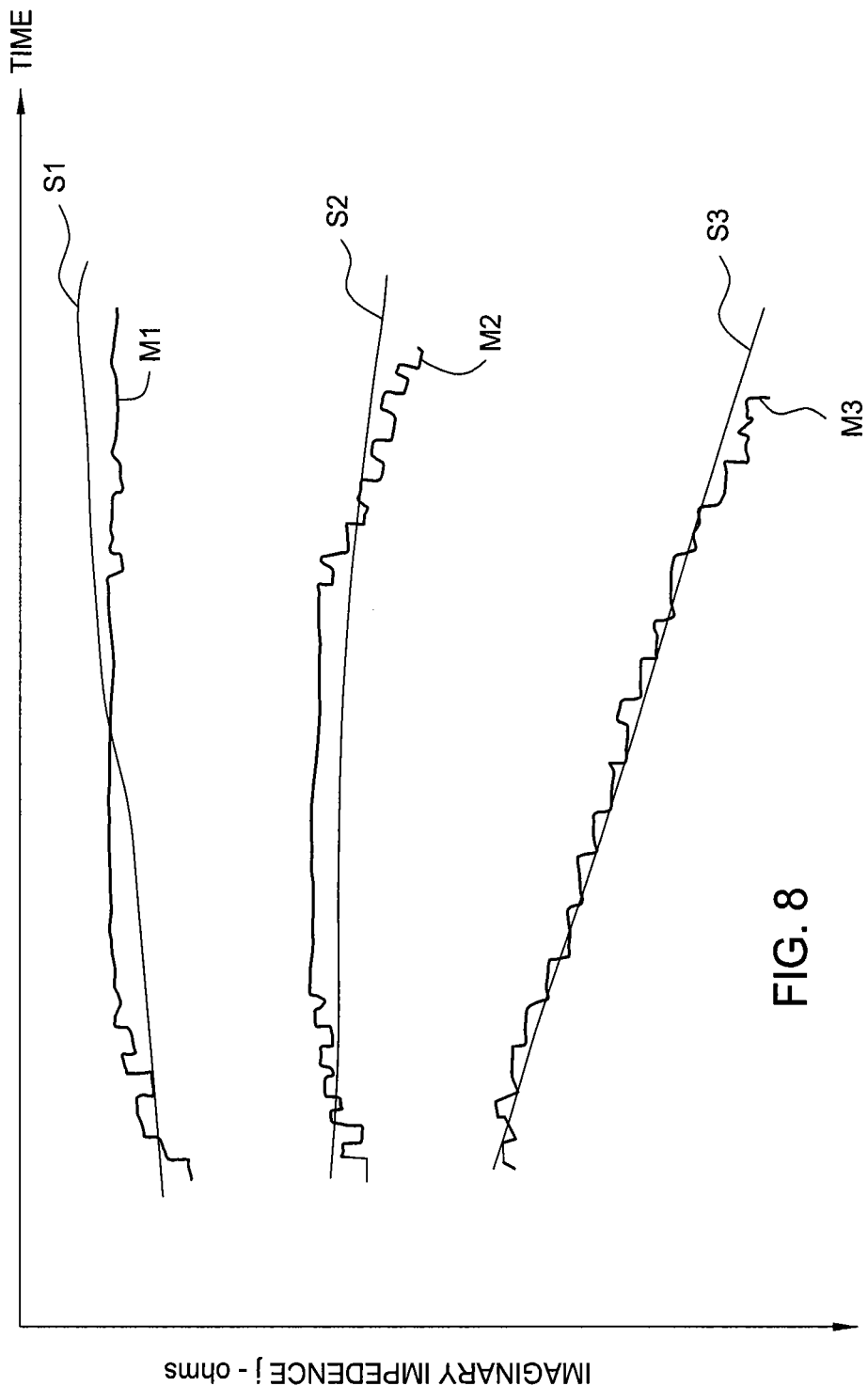
FIG. 8 schematically illustrates a chart showing measurements of imaginary impedance and calculated slopes of measured imaginary impedance of an electrostatic chuck.

FIG. 8 schematically illustrates a chart showing coordination between measurements of imaginary impedance of an electrostatic chuck and estimated slopes of the imaginary impedance. As shown in FIG. 7, imaginary impedance of an electrostatic chuck correlates to flatness of a substrate chucked on the electrostatic chuck during a plasma process.

Curves m1, m2, m3 of FIG. 8 schematically illustrate sensor measurements of the imaginary impedance of an electrostatic chuck. In one embodiment, imaginary impedance may be measured periodically and a slope may be calculated from measurements over a time duration to reduce noise from measurements. In one embodiment, slope may be calculated using a Slope Linear Regression. As shown in FIG. 8, measurements in curves m1, m2, m3 may be fitted into straight lines S1, S1, S3. The slope of the straight lines S1, S2, S3 generally provides flatness of the substrate disposed on the electrostatic chuck. Line S1 has a positive slope indicating that the substrate is relatively flat possibly from proper chucking. Line S2 has a small negative slope indicating the flatness of the substrate is at borderline. An increase in chucking voltage is probably needed to reduce substrate deformation. Line S3 has a relatively large negative slope indicating the substrate is curved possibly due to insufficient chucking from the electrostatic chuck.

It should be noted that slope of imaginary impedance may be obtained using any suitable methods, including other numerical methods and suitable filters.

Even though the electrostatic chuck described in the present application serves as a grounded electrode for a plasma generator, other circuiting is also applicable. Persons skilled in the art may adjust circuits of filters, impedance matching nextwork, and/or the sensors to measure electric characteristics of the electrostatic chuck.

Even though a PECVD system is described in this application, apparatus and method of the present invention may apply to any suitable plasma process.

While the foregoing is directed to embodiments of the present invention, other and further embodiments of the invention may be devised without departing from the basic scope thereof, and the scope thereof is determined by the claims that follow.

The invention claimed is:

1. A method for monitoring a substrate during a plasma process, comprising:
   positioning a substrate on an electrostatic chuck in a process chamber;
   applying an RF power between an electrode in the electrostatic chuck and a counter electrode positioned parallel to the electrostatic chuck;
   applying a DC bias to the electrode in the electrostatic chuck to clamp the substrate on the electrostatic chuck;
   monitoring slope variation of impedance of the electrostatic chuck over a time duration; and
   correlating slope variation of the impedance of the electrostatic chuck to a flatness of the substrate.

2. The method of claim 1, wherein the monitoring variation of impedance of the electrostatic chuck comprises monitoring variation of imaginary impedance of the electrostatic chuck.

3. The method of claim 2, further comprising adjusting the DC bias applied to the electrode in the electrostatic chuck according to the variation of imaginary impedance of the electrostatic chuck.

4. The method of claim 1, further comprising correlating an overall negative slope variation of the impedance of the electrostatic chuck to a decrease in the flatness of the substrate.

5. The method of claim 4, further comprising increasing the DC bias applied to the electrostatic chuck when the slope of the imaginary impedance is negative.

6. The method of claim 1, wherein the monitoring variation of impedance comprises measuring a voltage and a current of the electrostatic chuck.

7. The method of claim 6, wherein the voltage and the current are measured using a VI probe connected to the counter electrode.

8. The method of claim 1, wherein the monitoring variation of impedance of the process chamber is performed without measuring capacitances associated with the process chamber.

9. A method for monitoring a substrate during a plasma process, comprising:
   positioning a substrate in a plasma generator having first and second parallel electrodes, wherein the substrate is positioned between the first and second parallel electrodes and substantially parallel to the first and second parallel electrodes;
   applying an RF power between the first and second electrodes of the plasma generator;
   applying a DC bias to the first parallel electrode to secure the substrate directly or indirectly on the first parallel electrode; and
   monitoring flatness of the substrate by determining slope variation of imaginary impedance of the plasma generator over a time duration, wherein a negative slope indicates a decrease in the flatness of the substrate.

10. The method of claim 9, wherein the imaginary impedance is determined using a sensor connected to one of parallel electrodes of the plasma generator.

11. The method of claim 9, further comprising adjusting the DC bias to the first parallel electrode according to the slope variation of the imaginary impedance.

12. The method of claim 9, wherein the determining the slope variation of imaginary impedance of the plasma generator is performed without measuring capacitances associated with the plasma generator.

* * * * *